(12) United States Patent
Saito et al.

(10) Patent No.: US 12,081,195 B2
(45) Date of Patent: Sep. 3, 2024

(54) JOINED BODY AND SURFACE ACOUSTIC WAVE DEVICE

(71) Applicant: Sumitomo Electric Industries, Ltd., Osaka (JP)

(72) Inventors: Hirohisa Saito, Osaka (JP); Shigeru Nakayama, Osaka (JP); Yoshihiro Imagawa, Osaka (JP); Keiichiro Geshi, Osaka (JP); Yuichiro Yamanaka, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 653 days.

(21) Appl. No.: 17/422,769

(22) PCT Filed: Jan. 18, 2019

(86) PCT No.: PCT/JP2019/001552
§ 371 (c)(1),
(2) Date: Jul. 14, 2021

(87) PCT Pub. No.: WO2020/148909
PCT Pub. Date: Jul. 23, 2020

(65) Prior Publication Data
US 2022/0069802 A1 Mar. 3, 2022

(51) Int. Cl.
*H03H 9/25* (2006.01)
*C04B 35/443* (2006.01)
*H03H 9/02* (2006.01)
*H03H 9/64* (2006.01)

(52) U.S. Cl.
CPC ............. *H03H 9/25* (2013.01); *C04B 35/443* (2013.01); *H03H 9/02559* (2013.01); *H03H 9/02574* (2013.01); *H03H 9/6413* (2013.01)

(58) Field of Classification Search
CPC ....................... H03H 9/02559; H03H 9/02574
See application file for complete search history.

(56) References Cited

U.S. PATENT DOCUMENTS

| 2006/0197408 A1* | 9/2006 | Chen ......................... H03H 3/08 |
| | | 310/313 R |
| 2008/0024037 A1* | 1/2008 | Tamura ............... H03H 9/02834 |
| | | 29/25.35 |
| 2008/0303378 A1* | 12/2008 | Lee ..................... H03H 9/02582 |
| | | 310/313 A |
| 2012/0231218 A1* | 9/2012 | Nakayama ............. H03H 3/007 |
| | | 501/153 |
| 2016/0046528 A1 | 2/2016 | Miyazawa et al. |
| 2019/0356297 A1* | 11/2019 | Komiyama .......... B23K 26/402 |

FOREIGN PATENT DOCUMENTS

| JP | 2001-63048 A | 3/2001 |
| JP | 2006-304206 A | 11/2006 |
| JP | 2007-214902 A | 8/2007 |

(Continued)

*Primary Examiner* — Bryan P Gordon
(74) *Attorney, Agent, or Firm* — Faegre Drinker Biddle & Reath

(57) ABSTRACT

Provided is a joined body including a piezoelectric substrate and a polycrystalline spinel substrate provided on one main surface of the piezoelectric substrate, wherein the polycrystalline spinel substrate has a porosity of 0.005% or more and 0.6% or less.

5 Claims, 2 Drawing Sheets

(56) References Cited

FOREIGN PATENT DOCUMENTS

| JP | 2011-066818 A | 3/2011 |
|----|---------------|--------|
| JP | 2012-17218 A | 1/2012 |
| JP | 2016-100729 A | 5/2016 |
| JP | 2016-100744 A | 5/2016 |
| WO | WO-2015/129302 A1 | 9/2015 |

* cited by examiner

JOINED BODY AND SURFACE ACOUSTIC WAVE DEVICE

TECHNICAL FIELD

The present disclosure relates to a joined body and a surface acoustic wave device.

BACKGROUND ART

Inside a mobile phone, an electronic component called a surface acoustic wave (SAW) filter for cutting the noise of electrical signals and transmitting/receiving only an electrical signal having a desired frequency is embedded. For the SAW filter, a piezoelectric substrate made of a material having a piezoelectric effect is used.

On one surface of the piezoelectric substrate, a comb-shaped electrode having a pitch according to the wavelength of a transmission frequency band is formed. Due to an electrical signal inputted to the comb-shaped electrode, the piezoelectric substrate is subjected to stress and deformed, and an acoustic wave according to the pitch is generated. Further, the piezoelectric substrate deformed upon receiving an acoustic wave having a specific frequency causes the comb-shaped electrode to produce a potential. In order to promote the deformation of the piezoelectric substrate described above, it is effective to reduce the thickness of the piezoelectric substrate.

The transmission frequency of the SAW filter is determined by the pitch of the comb-shaped electrode. The pitch of the comb-shaped electrode changes due to expansion/contraction of the piezoelectric substrate caused by a change in ambient temperature. In order to suppress a change due to thermal expansion, a high strength and low thermal expansion support substrate is attached to a surface of the piezoelectric substrate opposite to the surface having the comb-shaped electrode formed thereon.

In PTL 1 (Japanese Patent Laying-Open No. 2006-304206), a silicon substrate is used as the support substrate described above. The thermal expansion coefficient of silicon is extremely low, when compared with the thermal expansion coefficient of a material forming the piezoelectric substrate, such as lithium tantalate. Therefore, when the piezoelectric substrate expands due to heat, silicon may be broken.

Further, a technique of using sapphire as the support substrate described above has also been proposed. However, since sapphire is a single crystal and has a high hardness, it is difficult to shape sapphire into a desired shape for downsizing. In addition, a single-crystal substrate of silicon or sapphire is generally expensive, and thus there has been a demand for a lower cost substrate.

Accordingly, PTL 2 (Japanese Patent Laying-Open No. 2011-66818) discloses a technique of using spinel, which is lower in cost and has a moderate strength, as a support substrate.

CITATION LIST

Patent Literature

PTL 1: Japanese Patent Laying-Open No. 2006-304206
PTL 2: Japanese Patent Laying-Open No. 2011-66818

SUMMARY OF INVENTION

[1] A joined body in accordance with one aspect of the present disclosure is a joined body including a piezoelectric substrate, and a polycrystalline spinel substrate provided on one main surface of the piezoelectric substrate, wherein the polycrystalline spinel substrate has a porosity of 0.005% or more and 0.6% or less.

[2] A surface acoustic wave device in accordance with another aspect of the present disclosure is a surface acoustic wave device including
the joined body described in [1] described above, and
an electrode provided on a main surface of the piezoelectric substrate opposite to the main surface provided with the polycrystalline spinel substrate.

DETAILED DESCRIPTION

Figure 1:
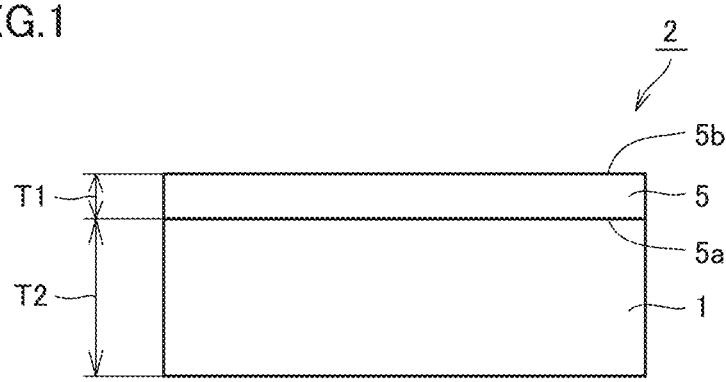
FIG. 1 is a schematic cross sectional view of a joined body in accordance with one embodiment of the present disclosure.

Problem to be Solved by the Present Disclosure

In a plane of a surface of a piezoelectric substrate, an acoustic wave generated by deformation of the piezoelectric substrate due to an electrical signal can be suppressed from propagating in an unnecessary direction due to the structure of a comb-shaped electrode, and its loss can be reduced. On the other hand, an acoustic wave propagating in the thickness direction of the piezoelectric substrate tends to propagate toward the support substrate and cause a loss. This tendency is particularly remarkable when the piezoelectric substrate has a thin thickness.

Accordingly, an object of the present disclosure is to provide a joined body including a support substrate which is low in cost and has a moderate strength, and capable of suppressing the loss of an acoustic wave, and a surface acoustic wave device including the joined body.

Advantageous Effect of the Present Disclosure

According to the aspect described above, it is possible to provide a joined body including a support substrate which is low in cost and has a moderate strength, and capable of suppressing the loss of an acoustic wave, and a surface acoustic wave device including the joined body.

Summary of Embodiments

First, aspects of the present disclosure will be described in list form.

(1) A joined body in accordance with one aspect of the present disclosure is a joined body including a piezoelectric substrate, and a polycrystalline spinel substrate provided on one main surface of the piezoelectric substrate, wherein
the polycrystalline spinel substrate has a porosity of 0.005% or more and 0.6% or less.

According to the aspect described above, the joined body includes a support substrate which is low in cost and has a moderate strength, and can suppress the loss of an acoustic wave.

(2) Preferably, the polycrystalline spinel substrate includes a plurality of crystal grains, and the crystal grains, have an average grain diameter of more than 1 μm and 60 μm or less.

Thereby, the loss of an acoustic wave can be suppressed more effectively, while maintaining the strength of the polycrystalline spinel substrate.

(3) Preferably, the polycrystalline spinel substrate includes the plurality of crystal grains, and the crystal grains have an average grain diameter of 5 μm or more and 30 μm or less.

Thereby, the loss of an acoustic wave can be suppressed further effectively, while maintaining the strength of the polycrystalline spinel substrate.

(4) Preferably, the piezoelectric substrate is made of lithium tantalate or lithium niobate. Thereby, the piezoelectric substrate can have an increased electromechanical coupling coefficient, and the piezoelectric substrate can have an improved frequency filtering characteristic.

(5) A surface acoustic wave device in accordance with another aspect of the present disclosure is a surface acoustic wave device including
the joined body described in any of (1) to (4) described above, and
an electrode provided on a main surface of the piezoelectric substrate opposite to the main surface provided with the polycrystalline spinel substrate.

According to the aspect described above, the surface acoustic wave device can suppress the loss of an acoustic wave.

Details of Embodiments

Specific examples of a joined body and a surface acoustic wave device in accordance with one embodiment of the present disclosure will be described below with reference to the drawings. In the drawings of the present disclosure, the same reference numerals designate identical or corresponding parts. In addition, dimensional relations in length, width, thickness, depth, and the like are changed as appropriate for clarity and simplicity of the drawings, and do not necessarily represent actual dimensional relations.

In the present specification, an expression in the form of "A to B" means lower and upper limits of a range (that is, A or more and B or less), and when A is not accompanied by any unit and B is alone accompanied by a unit, A has the same unit as B. In addition, an expression that the upper limit value of a range is C means that the upper limit of the range is C or less, and an expression that the lower limit value of a range is D means that the lower limit of the range is D or more.

First Embodiment: Joined Body

<Joined Body>

A joined body in accordance with the present embodiment will be described using FIG. 1. As shown in FIG. 1, a joined body 2 in accordance with the present embodiment includes a piezoelectric substrate 5, and a polycrystalline spinel substrate 1 provided on one main surface (hereinafter also referred to as a "first main surface") 5a of piezoelectric substrate 5, and polycrystalline spinel substrate 1 has a porosity of 0.005% or more and 0.6% or less.

As a result of earnest studies, the present inventors have newly found that a joined body including a piezoelectric substrate and a polycrystalline spinel substrate provided on one main surface of the piezoelectric substrate, wherein the polycrystalline spinel substrate has a porosity of 0.005% or more and 0.6% or less, includes a support substrate which is low in cost and has a moderate strength, and can suppress the loss of an acoustic wave. Although the reason therefor is not clearly known, it is presumed as described below in (i) to (iv).

(i) The joined body in accordance with the present embodiment uses the polycrystalline spinel substrate as a support substrate. The polycrystalline spinel substrate is made of a spinel sintered body, and has a moderate strength as a support substrate. Further, the polycrystalline spinel substrate is less expensive in material than a single-crystal substrate such as sapphire or silicon. Furthermore, the polycrystalline spinel substrate has a Knoop hardness lower than that of sapphire, and is easily processed into a desired shape. Thus, manufacturing cost can be reduced.

(ii) The acoustic wave transmitting through a substance is divided into a transmitted wave and a reflected wave at a boundary between solids made of different substances (for example, a boundary between the piezoelectric substrate and the polycrystalline spinel substrate), whereas most of the acoustic wave becomes a reflected wave at an interface between a solid and a gas. The polycrystalline spinel substrate used for the joined body in accordance with the present embodiment includes pores in the inside thereof. Accordingly, most of the acoustic wave propagating from the piezoelectric substrate to the polycrystalline spinel substrate becomes a reflected wave at an interface between the spinel sintered body and the pores in the inside of the polycrystalline spinel substrate, and returns toward the piezoelectric substrate. Therefore, the loss of the acoustic wave can be suppressed.

(iii) The pores in the polycrystalline spinel substrate are pores incorporated into grain boundaries between spinel grains in a sintering step during fabrication of the spinel sintered body, or are pores incorporated into grains during grain growth. The pores exist dispersedly in the polycrystalline spinel substrate without being unevenly distributed. Accordingly, the effect of uniformly reflecting the acoustic wave can be achieved in the entire polycrystalline spinel substrate, and the loss of the acoustic wave can be suppressed.

(iv) In the joined body of the present embodiment, the polycrystalline spinel substrate has a porosity of 0.005% or more and 0.6% or less. Thereby, the polycrystalline spinel substrate can have an excellent effect of reflecting the acoustic wave, the effect of suppressing thermal expansion of the piezoelectric substrate, and a sufficient strength of joining to the piezoelectric substrate, while maintaining the moderate strength.

It should be noted that, when the porosity of the polycrystalline spinel substrate is less than 0.005%, it tends to be difficult to achieve the effect of reflecting the acoustic wave by the pores. On the other hand, when the porosity is more than 0.6%, the reflecting effect is enhanced, but the elastic modulus decreases, and thus it tends to be difficult to achieve the effect as a support substrate of suppressing the thermal expansion of the piezoelectric substrate. Further, when the porosity is more than 0.6%, the contact area at a joining interface between the polycrystalline spinel substrate and the piezoelectric substrate decreases, and thus the joining strength tends to decrease.

(Shape)

The average thickness of joined body 2 is preferably 50 µm or more and 700 µm or less, more preferably 80 µm or more and 500 µm or less, and further preferably 100 µm or more and 300 µm or less. Here, the thickness of the joined body is a value measured in a cross section parallel to the direction of a normal to a main surface of the joined body, with a micrometer. The measurement is performed at three positions in one cross section, and the average value of thicknesses at the three positions is obtained as the average thickness of the joined body.

It should be noted that, in the measurement performed by the Applicant, it has been confirmed that, as long as the measurement is performed in the same sample, even though the average thickness of the joined body is calculated a plurality of times while changing the location for selecting an observed cross section, calculation results have almost no variation, and thus there is no arbitrariness even when any observed cross section is set.

It should be noted that, although the main surface of the joined body described above includes a surface 5b of the piezoelectric substrate and a surface of the polycrystalline spinel substrate, the main surface of the joined body in the present specification shall indicate surface 5b of the piezoelectric substrate.

The shape and the size of the main surface of joined body 2 are not particularly limited, and can be adjusted as appropriate depending on the usage of the surface acoustic wave device. The main surface of joined body 2 may have a shape of a circle, or may have a shape of a rectangle, for example. When the shape of the main surface of joined body 2 is a circle, the diameter thereof can be 50 mm or more and 200 mm or less. When the shape of the main surface of joined body 2 is a rectangle, the one side length thereof can be 0.1 mm or more and 5 mm or less. The area of the main surface of the joined body can be 0.01 $mm^2$ or more and 25 $mm^2$ or less, for example.

(Joining between Piezoelectric Substrate and Polycrystalline Spinel Substrate)

The method of joining piezoelectric substrate 5 and polycrystalline spinel substrate 1 is not particularly limited, and they may be joined using an adhesive, or may be joined by van der Waals force. In order to join the piezoelectric substrate and the polycrystalline spinel substrate with high accuracy, it is preferable that the piezoelectric substrate and the polycrystalline spinel substrate are joined by the van der Waals force. More specifically, it is preferable that atoms of a material constituting the piezoelectric substrate are joined to atoms of spinel constituting the polycrystalline spinel substrate by the van der Waals force.

<Piezoelectric Substrate>

Piezoelectric substrate 5 is a substrate which exhibits a piezoelectric effect of converting an electrical signal into mechanical vibration. As a main component of piezoelectric substrate 5, for example, lithium tantalate, lithium niobate, lithium borate, or the like can be used. Among these components, lithium tantalate or lithium niobate, which is excellent in electromechanical coupling coefficient, is preferable. Piezoelectric substrate 5 can be obtained, for example, by producing a single crystal rod of the component described above by the Czochralski method, and slicing the single crystal rod. It should be noted that the substrate orientation (cut angle) can be set to 36° to 50°, for example, and can be selected as appropriate depending on the usage of the surface acoustic wave device, and the like.

The lower limit of an average thickness T1 of piezoelectric substrate 5 is preferably 0.1 µm, more preferably 1 µm, and further preferably 3 µm. When average thickness T1 of piezoelectric substrate 5 is less than 0.1 µm, it may become difficult to process piezoelectric substrate 5. On the other hand, the upper limit of average thickness T1 of piezoelectric substrate 5 is preferably 50 µm, more preferably 25 µm, and further preferably 10 µm. When average thickness T1 of piezoelectric substrate 5 is more than 50 µm, expansion or contraction of piezoelectric substrate 5 due to a temperature change may increase, or joined body 2 may become unnecessarily thick. Average thickness T1 of piezoelectric substrate 5 is preferably 0.1 µm or more and 50 µm or less, more preferably 1 µm or more and 25 µm or less, and further preferably 3 µm or more and 10 µm or less.

The thickness of the piezoelectric substrate described above is a value measured in a cross section parallel to the direction of a normal to second main surface 5b of the piezoelectric substrate, by a reflection spectroscopy interference method. The measurement is performed at three positions in one cross section, and the average value of thicknesses at the three positions is obtained as the average thickness of the piezoelectric substrate.

It should be noted that, in the measurement performed by the Applicant, it has been confirmed that, as long as the measurement is performed in the same sample, even though the average thickness of the piezoelectric substrate is calculated a plurality of times while changing the location for selecting an observed cross section, calculation results have almost no variation, and thus there is no arbitrariness even when any observed cross section is set.

The upper limit of the arithmetic average roughness (Ra) of first main surface 5a of piezoelectric substrate 5 is preferably 1 nm, and more preferably 0.8 nm. When the arithmetic average roughness (Ra) of first main surface 5a of piezoelectric substrate 5 is more than 1 nm, the strength of adhesion to polycrystalline spinel substrate 1 by the van der Waals force may decrease. On the other hand, the lower limit of the arithmetic average roughness (Ra) of first main surface 5a of piezoelectric substrate 5 is preferably 0.05 nm. When the arithmetic average roughness (Ra) of first main surface 5a of piezoelectric substrate 5 is less than 0.05 nm, a bulk wave may be likely to be reflected between piezoelectric substrate 5 and polycrystalline spinel substrate 1 and thus spurious response may increase.

In the present specification, the arithmetic average roughness (Ra) means the arithmetic average roughness defined in JIS B 0601. The arithmetic average roughness is a value measured with an atomic force microscope (AFM) or the like.

The upper limit of the linear expansion coefficient of piezoelectric substrate 5 is preferably $30\times10^{-6}/°$ C., and more preferably $20\times10^{-6}/°$ C. When the linear expansion coefficient of piezoelectric substrate 5 is more than $30\times10^{-6}/°$ C., expansion or contraction of the piezoelectric substrate due to a temperature change may increase. On the other hand, although the lower limit of the linear expansion coefficient of piezoelectric substrate 5 is not particularly limited, it is preferably $8\times10^{-6}/°$ C., and more preferably $10\times10^{-6}/°$ C., for example.

The linear expansion coefficient described above is a value measured by a compressive load method (with "Thermomechanical Analyzer TMA8310" manufactured by Rigaku Corporation).

Piezoelectric substrate 5 may contain a component other than the main component described above, and, for example, a metal may be added thereto. The mechanical strength, the heat resistance, and the like of piezoelectric substrate 5 can be improved by adding a metal element thereto.

<Polycrystalline Spinel Substrate>

Polycrystalline spinel substrate 1 is a substrate made of a spinel sintered body. Polycrystalline spinel substrate 1 is a support substrate for increasing the strength of joined body 2 and suppressing the thermal expansion of the piezoelectric substrate. Examples of spinel constituting polycrystalline spinel substrate 1 include $MgO \cdot nAl_2O_3$ ($1 \leq n \leq 3$). The lower limit of the value of n is preferably 1, more preferably 1.03, and further preferably 1.05. When the value of n is less than 1, there is a tendency that MgO increases locally and porosity increases. The upper limit of the value of n is preferably 3, more preferably 2, and further preferably 1.5. When the value of n is more than 3, there is a tendency that $Al_2O_3$ increases locally, the $Al_2O_3$ is unevenly distributed with pores, and white turbidity visually increases. The value of n is preferably 1 or more and 3 or less, more preferably 1.03 or more and 2 or less, and further preferably 1.05 or more and 1.5 or less.

The composition of the polycrystalline spinel substrate and the value of n in the composition formula $MgO \cdot nAl_2O_3$ can be measured by an X-ray diffraction matrix flushing method.

Polycrystalline spinel substrate 1 may contain a component other than spinel, and can contain an alumina component, for example. The upper limit value of the content of the component other than spinel in the polycrystalline spinel substrate is preferably 10 mass %, and more preferably 5 mass %. The lower limit value of the content of the component other than spinel in the polycrystalline spinel substrate is preferably 3 mass %, more preferably 1 mass %, and further preferably 0, that is, it is further preferable that the polycrystalline spinel substrate does not contain a component other than spinel.

Polycrystalline spinel substrate 1 has a porosity of 0.005% or more and 0.6% or less. The lower limit of the porosity is 0.005%, preferably 0.01%, and more preferably 0.05%. When the lower limit of the porosity is less than 0.005%, it tends to be difficult to achieve the effect of reflecting the acoustic wave by the pores. The upper limit of the porosity is 0.6%, and preferably 0.5%. When the porosity is more than 0.6%, the reflecting effect is enhanced, but the elastic modulus decreases, and thus it tends to be difficult to achieve the effect as a support substrate of suppressing the thermal expansion of the piezoelectric substrate. Further, when the porosity is more than 0.6%, the area of contact points at the joining interface between the polycrystalline spinel substrate and the piezoelectric substrate decreases, and thus the joining strength tends to decrease. The porosity of the polycrystalline spinel substrate is 0.005% or more and 0.6% or less, preferably 0.01% or more and 0.6% or less, more preferably 0.01% or more and 0.5% or less, and further preferably 0.05% or more and 0.5% or less.

The porosity of the polycrystalline spinel substrate is measured by a water immersion method. A specific procedure for the water immersion method is as described below in (a1) to (a3).

(a1) The polycrystalline spinel substrate is cut into the shape of a cylinder with a size of ϕ100 mm×40 mm to obtain a measurement sample.

(a2) The measurement sample is immersed in water to determine an apparent volume of the measurement sample by Archimedes' principle. An apparent density ($\rho$) is determined from the ratio between the apparent volume and the mass of the measurement sample. To measure the apparent volume, an electronic balance ("UX200H" manufactured by SHIMADZU) is used.

(a3) Using the determined apparent density ($\rho$) and a true density ($\rho_0$), a porosity ($\varepsilon$) is calculated by the following equation (1).

$$\text{Porosity } (\varepsilon)(\%) = (1 - \rho/\rho_0) \times 100$$

Preferably, the pores exist dispersedly in polycrystalline spinel substrate 1. Thereby, the effect of uniformly reflecting the acoustic wave can be achieved in the entire polycrystalline spinel substrate, and the loss of the acoustic wave can be suppressed. The state where the pores exist dispersedly in the polycrystalline spinel substrate can be confirmed by visually checking that no white turbidity is visible, or through observation with a scanning electron microscope (SEM).

It should be noted that, since sapphire and silicon are single-crystal materials, pores rarely exist therein, and it has been difficult to distribute pores as appropriate. Accordingly, in a single-crystal substrate of sapphire or silicon, it is necessary to perform expensive microfabrication to achieve the effect of uniformly reflecting the acoustic wave. On the other hand, the pores in the polycrystalline spinel substrate are pores incorporated into grain boundaries between spinel grains in the sintering step during fabrication of the spinel sintered body, or are pores incorporated into grains during grain growth. The pores exist dispersedly in the polycrystalline spinel substrate without being unevenly distributed. Therefore, the polycrystalline spinel substrate does not require expensive microfabrication, and is advantageous also from the aspect of cost.

The shape of the pores in the polycrystalline spinel substrate gets closer to the most stable spherical shape during crystal growth. However, the shape of the pores does not have to be a complete spherical shape. On the other hand, in order to reflect the acoustic wave, it is preferable that the projection area of each pore with respect to the direction of movement of the acoustic wave is stably wide. For example, when the ratio of the minimum diameter to the maximum diameter in a projection image of each pore with respect to the direction of movement of the acoustic wave is 80% or more, the effect of confining the acoustic wave is further improved, which is preferable.

The shape of the pores can be confirmed with a SEM.

The average diameter of the pores in the polycrystalline spinel substrate in projection images of the pores with respect to the direction of movement of the acoustic wave is preferably 0.01 μm or more and 20 μm or less, more preferably 0.05 μm or more and 10 μm or less, and further preferably 0.1 μm or more and 5 μm or less. When the average diameter is less than 0.01 μm, the reflecting effect may be less likely to be exhibited. On the other hand, when the average diameter is more than 20 μm, the pores tend to be unevenly distributed in the polycrystalline spinel substrate, and it tends to be difficult to achieve the effect of uniformly confining the acoustic wave.

The average diameter of the pores in the projection images with respect to the direction of movement of the acoustic wave described above means a median diameter (d50) in volume-based particle size distribution (volume distribution), and means an average particle diameter of all pores included in the polycrystalline spinel substrate.

The diameter of each pore for calculating the average particle diameter of the pores can be measured with a SEM.

It should be noted that, in the measurement performed by the Applicant, it has been confirmed that, as long as the measurement is performed in the same sample, even though the average diameter of the pores is calculated a plurality of times while changing the location for selecting a measurement visual field, calculation results have almost no variation, and thus there is no arbitrariness even when any measurement visual field is set.

Preferably, the polycrystalline spinel substrate includes a plurality of crystal grains, and the crystal grains have an average grain diameter of more than 1 μm and 60 μm or less. Thereby, the loss of the acoustic wave can be suppressed more effectively.

When the average grain diameter of the crystal grains described above is 1 μm or less, the porosity of the polycrystalline spinel substrate increases too much and the elastic modulus thereof decreases, and thus it tends to be difficult to achieve the effect as a support substrate of suppressing the thermal expansion of the piezoelectric substrate. Further, the area of contact points at the joining interface between the polycrystalline spinel substrate and the piezoelectric substrate decreases, and thus the joining strength decreases. On the other hand, when the average grain diameter of the crystal grains described above is more than 60 μm, pores present at grain boundaries between spinel grains tend to be unevenly distributed. The average grain diameter of the polycrystalline spinel substrate is more preferably 5 μm or more and 30 μm or less, and further preferably 8 μm or more and 25 μm or less.

The grain diameter of each grain for calculating the average grain diameter of the crystal grains can be measured by the following method. First, a surface of the polycrystalline spinel substrate is mirror-polished, and a rectangular measurement visual field of 0.17 mm×0.13 mm is determined on the polished surface. The polycrystalline spinel substrate in the measurement visual field is observed with an optical microscope at a magnification of 1000 times. Then, in this optical microscope image, the number of crystal grains constituting the polycrystalline spinel substrate is counted, and a value obtained by dividing the area of the measurement visual field with the number of crystal grains is determined as the grain diameter of the crystal grains.

It should be noted that, in the measurement performed by the Applicant, it has been confirmed that, as long as the measurement is performed in the same sample, even though the average grain diameter of the crystal grains included in the polycrystalline spinel substrate is calculated a plurality of times while changing the location for selecting a measurement visual field, calculation results have almost no variation, and thus there is no arbitrariness even when any measurement visual field is set.

The lower limit of an average thickness T2 of polycrystalline spinel substrate 1 is preferably 100 μm, more preferably 150 μm, and further preferably 200 μm. When average thickness T2 of polycrystalline spinel substrate 1 is less than 100 μm, it may not be possible to sufficiently suppress the thermal expansion of the piezoelectric substrate. On the other hand, the upper limit of average thickness T2 of polycrystalline spinel substrate 1 is preferably 500 μm, more preferably 400 μm, and further preferably 300 μm. When average thickness T2 of polycrystalline spinel substrate 1 is more than 500 μm, a bulk wave may be likely to be reflected at a boundary between piezoelectric substrate 5 and polycrystalline spinel substrate 1, or joined body 2 may become unnecessarily thick.

The thickness of the polycrystalline spinel substrate described above is a value measured in a cross section parallel to the direction of a normal to a main surface of the polycrystalline spinel substrate, by the reflection spectroscopy interference method. The measurement is performed at three positions in one cross section, and the average value of thicknesses at the three positions is obtained as the average thickness of the polycrystalline spinel substrate.

T1/T2, which is the ratio between average thickness T1 of piezoelectric substrate 5 and average thickness T2 of polycrystalline spinel substrate 1, is 0.1 or less, and thus average thickness T2 of the polycrystalline spinel substrate is sufficiently large relative to average thickness T1 of the piezoelectric substrate. Accordingly, the polycrystalline spinel substrate can sufficiently suppress the thermal expansion of the piezoelectric substrate, and the joined body can have an excellent frequency temperature characteristic with little variation.

The upper limit of the ratio T1/T2 described above is 0.1, preferably 0.04, and more preferably 0.02. When the ratio T1/T2 is more than 0.1, the frequency temperature characteristic (TCF) tends to be deteriorated.

On the other hand, the lower limit of the ratio T1/T2 described above is preferably 0.0002, more preferably 0.002, and further preferably 0.006. When the ratio T1/T2 is less than 0.0002, the processing accuracy of piezoelectric substrate 5 may decrease. Further, deformation of joined body 2 due to a temperature change may increase, or the mechanical strength thereof may decrease.

The lower limit of the arithmetic average roughness (Ra) of the surface of polycrystalline spinel substrate 1 is preferably 0.01 nm, and more preferably 0.1 nm. When the arithmetic average roughness (Ra) of the surface of polycrystalline spinel substrate 1 is less than 0.01 nm, it is necessary to process polycrystalline spinel substrate 1 to have a very flat surface, and thus the processing cost tends to increase. On the other hand, the upper limit of the arithmetic average roughness (Ra) of the surface of polycrystalline spinel substrate 1 is preferably 3.0 nm, and more preferably 2.0 nm. When the arithmetic average roughness (Ra) of the surface of polycrystalline spinel substrate 1 is more than 3.0 nm, the adhesion strength may decrease in the case of adhesion between piezoelectric substrate 5 and polycrystalline spinel substrate 1 by the van der Waals force.

The upper limit of the linear expansion coefficient of polycrystalline spinel substrate 1 is preferably $16\times10^{-6}/°$ C., and more preferably $8\times10^{-6}/°$ C. When the linear expansion coefficient of polycrystalline spinel substrate 1 is more than $16\times10^{-6}/°$ C., it may not be possible to sufficiently suppress the thermal expansion of the piezoelectric substrate. On the other hand, the lower limit of the linear expansion coefficient of polycrystalline spinel substrate 1 is preferably $1\times10^{-6}/°$ C., and more preferably $3\times10^{-6}/°$ C. When the linear expansion coefficient of polycrystalline spinel substrate 1 is less than $1\times10^{-6}/°$ C., the difference in linear expansion coefficient between polycrystalline spinel substrate 1 and piezoelectric substrate 5 may increase, and distortion of polycrystalline spinel substrate 1 may increase when the temperature changes.

The linear expansion coefficient described above is a value obtained through measurement in a rod-shaped material with a linear thermal expansion measuring device.

The lower limit of the difference in linear expansion coefficient between polycrystalline spinel substrate 1 and piezoelectric substrate 5 is preferably $5\times10^{-6}/°$ C., and more preferably $7\times10^{-6}/°$ C. When the difference in linear expansion coefficient between polycrystalline spinel substrate 1 and piezoelectric substrate 5 is less than $5\times10^{-6}/°$ C., it may not be possible to sufficiently suppress the thermal expansion of the piezoelectric substrate. On the other hand, the upper limit of the difference in linear expansion coefficient between polycrystalline spinel substrate 1 and piezoelectric substrate 5 is preferably $20\times10^{-6}/°$ C. When the difference in linear expansion coefficient between polycrystalline spinel substrate 1 and piezoelectric substrate 5 is more than $20\times10^{-6}/°$ C., distortion of polycrystalline spinel substrate 1 may increase when the temperature changes.

Polycrystalline spinel substrate 1 supports piezoelectric substrate 5 which vibrates upon receiving an electrical signal. Accordingly, polycrystalline spinel substrate 1 is subjected to a considerable stress. Further, when piezoelectric substrate 5 operates, piezoelectric substrate 5 generates heat, and the heat also propagates to polycrystalline spinel substrate 1. On this occasion, thermal stress is generated in polycrystalline spinel substrate 1. Accordingly, polycrystalline spinel substrate 1 preferably has an appropriate strength.

The lower limit of the Young's modulus of polycrystalline spinel substrate 1 is preferably 100 GPa, more preferably 150 GPa, and further preferably 180 GPa. When the Young's modulus of polycrystalline spinel substrate 1 is less than 100 GPa, polycrystalline spinel substrate 1 may be likely to be broken. On the other hand, the upper limit of the Young's modulus of polycrystalline spinel substrate 1 is preferably 400 GPa, more preferably 350 GPa, and further preferably 300 GPa. When the Young's modulus of polycrystalline spinel substrate 1 is more than 400 GPa, polycrystalline spinel substrate 1 has an excessively high hardness, and thus chipping is highly likely to occur. Further, since polycrystalline spinel substrate 1 has an excessively high hardness, it may become difficult to process polycrystalline spinel substrate 1.

In the present specification, the Young's modulus is a value measured by a three-point bending test performed in conformity with JIS R 1602. The measurement is performed using "Material Testing Machine AL-50NB" manufactured by Minebea Co., Ltd.

The lower limit of the Knoop hardness of polycrystalline spinel substrate 1 is preferably 1000, and more preferably 1200. When the Knoop hardness of polycrystalline spinel substrate 1 is less than 1000, polycrystalline spinel substrate 1 may be likely to be broken. On the other hand, the upper limit of the Knoop hardness of polycrystalline spinel substrate 1 is preferably 2500, and more preferably 1800. When the Knoop hardness of polycrystalline spinel substrate 1 is more than 2500, it may become difficult to process polycrystalline spinel substrate 1.

In the present specification, the Knoop hardness is a value measured with "Hardness Testing Machine HM" manufactured by Mitutoyo Corporation.

<Method for Manufacturing Joined Body>

The method for manufacturing a joined body in accordance with the present embodiment can include a step of preparing a piezoelectric substrate, a step of preparing a polycrystalline spinel substrate, and a step of joining the piezoelectric substrate and the polycrystalline spinel substrate to obtain a joined body (hereinafter also referred to as a "joining step").

Step of Preparing Piezoelectric Substrate

First, a piezoelectric substrate is prepared. As the piezoelectric substrate, a conventionally known piezoelectric substrate can be used. Then, main surfaces of the piezoelectric substrate are polished. Specifically, the main surfaces of the piezoelectric substrate are roughly polished by grinding, and thereafter, chemical mechanical polishing (CMP) is performed on a surface to be joined to the polycrystalline spinel substrate, to reduce its surface roughness until it has an arithmetic average roughness (Ra) of about 0.05 µm or more and 1 µm or less.

Step of Preparing Polycrystalline Spinel Substrate

The step of preparing a polycrystalline spinel substrate can include a spinel powder preparing step, a molding step, a sintering step, and a processing step.

In the spinel powder preparing step, powder made of spinel and having a composition formula of $MgO·nAl_2O_3$ ($1\le n\le 3$) is prepared. Preferably, the spinel powder has an average particle diameter of 0.1 µm or more and 0.3 µm or less, and a purity of 99.5% or more.

In order to prepare the spinel powder having the composition described above, it is preferable to mix MgO (magnesium oxide) powder and $Al_2O_3$ (alumina) powder at a mixing ratio (mass ratio) of $1\le Al_2O_3/MgO\le 3$.

The particle diameter of each particle for calculating the average particle diameter of the spinel powder is measured using a particle diameter distribution measurement method based on a laser diffraction/scattering method. Specifically, it is a method of measuring the diameter of each powder particle by analyzing distribution of the scattering intensity of the scattered light of a laser beam emitted onto the powder particle.

Then, the molding step is performed. Specifically, the spinel powder is molded by press molding or cold isostatic pressing (CIP) to obtain a molded body. More specifically, it is preferable to first preform the powder of $MgO·nAl_2O_3$ prepared in the spinel powder preparing step by press molding, and thereafter perform CIP to obtain a molded body. It should be noted that only one of press molding and CIP may be performed, or both may be performed, for example by performing press molding and thereafter performing CIP.

In the press molding, it is preferable to use a pressure of, for example, 1 MPa or more and 300 MPa or less, and in particular, 10 MPa or more and 100 MPa or less. In the CIP, it is preferable to use a pressure of, for example, 160 MPa or more and 250 MPa or less, and in particular, 180 MPa or more and 230 MPa or less.

Then, the sintering step is performed. Specifically, the molded body is sintered in vacuum under a temperature condition of 1500° C. or more and 1700° C. or less (a first sintering step), and thereafter is sintered by hot isostatic pressing (HIP) under a temperature condition of 1600° C. or more and 1800° C. or less while changing the pressure in multiple stages (a second sintering step). Thereby, a spinel ingot made of the spinel sintered body having a porosity of 0.005% or more and 0.6% or less can be obtained.

Preferably, the second sintering step described above more specifically includes a second sintering step (a) of sintering the molded body under a temperature condition of 1600° C. or more and 1800° C. or less, under a pressure of 100 MPa or more and 200 MPa or less, for 1 minute or more and 60 minutes or less, and a second sintering step (b) of sintering the molded body under a temperature condition of 1600° C. or more and 1800° C. or less, under a pressure of 150 MPa or more and 300 MPa or less, for 10 minutes or more and 300 minutes or less.

Then, the processing step is performed. Specifically, the obtained spinel ingot is sliced with a diamond wire saw to have a desired thickness. Thereby, a base of a polycrystalline spinel substrate having a desired thickness is completed. Here, preferably, the desired thickness is determined in consideration of the thickness of the polycrystalline spinel substrate to be finally formed, the polishing allowance of main surfaces of the polycrystalline spinel substrate in a subsequent step, and the like.

Then, the main surfaces of the polycrystalline spinel substrate are polished. Specifically, the main surfaces of the polycrystalline spinel substrate are roughly polished by grinding, and thereafter, chemical mechanical polishing (CMP) is performed on a surface to be finally joined to the piezoelectric substrate, to reduce its surface roughness until it has an arithmetic average roughness (Ra) of about 0.01 nm or more and 3.0 nm or less. Thereby, the polycrystalline spinel substrate can be joined to the main surface of the piezoelectric substrate by the van der Waals force.

(Joining Step)

Then, the piezoelectric substrate and the polycrystalline spinel substrate prepared above are joined to obtain a joined body. Specifically, the piezoelectric substrate and the polycrystalline spinel substrate are placed within a vacuum chamber such that the polished surface of the polycrystalline spinel substrate faces the polished surface of the piezoelectric substrate. With this state being maintained, an internal gas within the chamber is exhausted to achieve a high vacuum state. Thereafter, a fast atomic beam of neutralized argon is emitted onto the polished surfaces of the both substrates, and then the both substrates are brought closer to each other and joined to obtain a joined body.

Second Embodiment: Surface Acoustic Wave Device

<Configuration of Surface Acoustic Wave Device>

A surface acoustic wave device in accordance with the present embodiment will be described using FIGS. 2 to 4.

Figure 2:
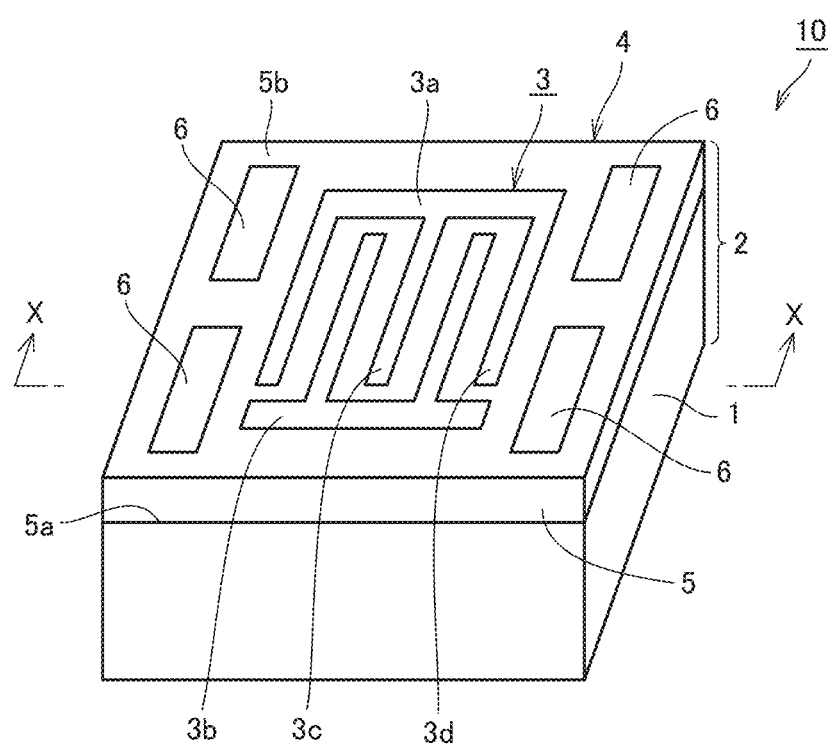
FIG. 2 is a perspective view showing an example of a joined substrate having an electrode formed on a main surface of the joined body of FIG. 1.
Figure 3:
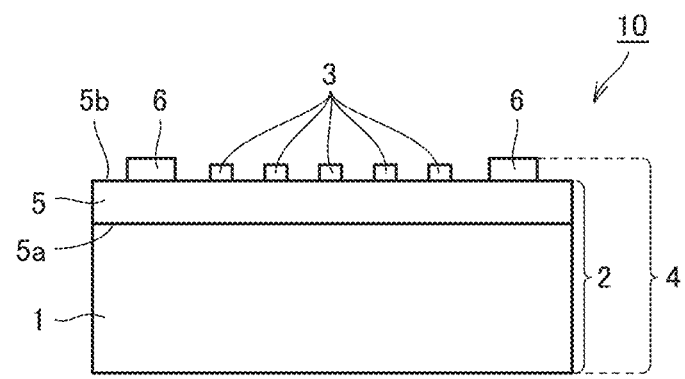
FIG. 3 is a cross sectional view of the joined substrate of FIG. 2 cut along an X-X line.

As shown in FIGS. 2 and 3, a surface acoustic wave device 10 in accordance with the present embodiment includes joined body 2 described in the first embodiment, and an electrode 3 provided on a main surface (second main surface 5b) of piezoelectric substrate 5 opposite to a surface (first main surface 5a) provided with polycrystalline spinel substrate 1. Joined body 2 includes piezoelectric substrate 5, and the polycrystalline spinel substrate provided on one main surface (first main surface 5a) of piezoelectric substrate 5.

Since the configurations of the joined body, the piezoelectric substrate, and the polycrystalline spinel substrate used in the present embodiment are the same as the configurations described in the first embodiment, the description thereof will not be repeated.

Electrode 3 can include a first pole 3a and a second pole 3b. For example, an AC voltage is applied between first pole 3a and second pole 3b. Then, an electrical signal is inputted to a current caused by the AC voltage applied between first pole 3a and second pole 3b. Thereby, crystal grains (atoms) constituting piezoelectric substrate 5 provided with electrode 3 are subjected to stress, and thus come closer to or separate from one another due to the piezoelectric effect. Accordingly, the main surface of piezoelectric substrate 5 vibrates like a wave.

Each of first pole 3a and second pole 3b can have a comb shape. Thus, for example, among electrical signals inputted to electrode 3, only an electrical signal having a wavelength corresponding to the distance between a comb-shaped component 3c and a comb-shaped component 3d of first pole 3a is propagated to the outside. That is, an electrical signal having a wavelength other than the wavelength described above is not propagated to the outside, and is interrupted inside joined body 2. Based on such a principle, joined body 2 can output only an electrical signal having a desired wavelength to the outside, and thereby can interrupt an electrical signal having a wavelength other than the desired wavelength (that is, noise) and eliminate the noise of an output signal.

As shown in FIGS. 2 and 3, second main surface 5b of the piezoelectric substrate can further be provided with an electrode member 6.

It should be noted that, as shown in FIGS. 2 and 3, piezoelectric substrate 5, electrode 3 provided on second main surface 5b of the piezoelectric substrate, and polycrystalline spinel substrate 1 joined to first main surface 5a of the piezoelectric substrate form a joined substrate 4. Joined substrate 4 can further include first electrode member 6.

In the present specification, the surface acoustic wave device may be formed only of joined substrate 4, or may include another component in addition to joined substrate 4, as described below. An example in which the surface acoustic wave device includes another component in addition to joined substrate 4 will be described using FIG. 4.

Figure 4:
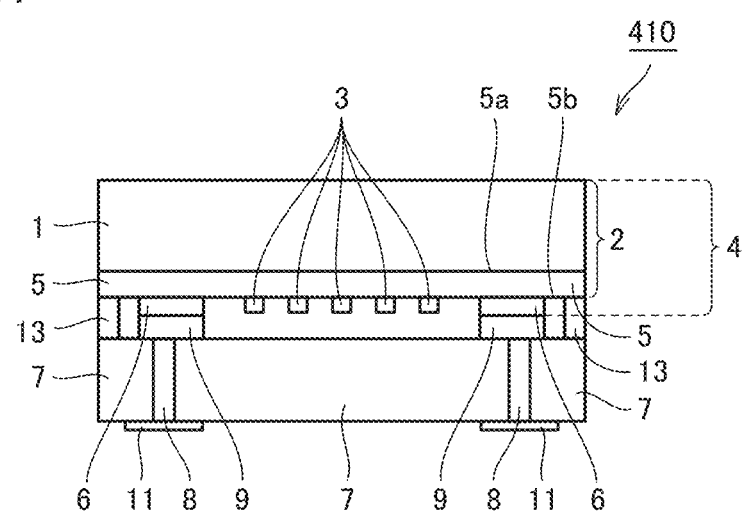
FIG. 4 is a schematic cross sectional view of a surface acoustic wave device in accordance with one embodiment of the present disclosure.

As shown in FIG. 4, a surface acoustic wave device 410 can further include a sealing substrate 7 for sealing electrode 3, in addition to joined substrate 4. Of main surfaces of sealing substrate 7, one main surface facing joined substrate 4 has a second electrode member 9 made of a metallic thin film formed thereon, and the other main surface has an external terminal 11 formed thereon. Second electrode member 9 and external terminal 11 are electrically connected through a via wire 8 penetrating sealing substrate 7.

Since first electrode member 6 and second electrode member 9 are disposed to be in contact with each other in surface acoustic wave device 410, first electrode member 6 and external terminal 11 are also electrically connected through second electrode member 9 and via wire 8.

Joined substrate 4 and sealing substrate 7 are joined through an adhesive member 13. Adhesive member 13 is provided to surround electrode 3, first electrode member 6, and second electrode member 9. Therefore, electrode 3, the first electrode member, and the second electrode member are cut off from the outside and are hermetically sealed. It should be noted that joined substrate 4 and sealing substrate 7 may be directly joined by pressure bonding, without using an adhesive member.

As adhesive member 13, a metal or a resin can be used. As the metal, gold, platinum, silver, copper, aluminum, nickel, titanium, a gold alloy, a metal having a surface coated with gold, or the like can be used. As the resin, an epoxy resin, an acrylic resin, a silicone resin, a polyimide resin, a polyamide resin, a polyamide imide resin, or the like can be used.

As sealing substrate 7, spinel is preferably used.

The average thickness of sealing substrate 7 is preferably 10 μm or more and 1000 μm or less.

The thickness of surface acoustic wave device 410 is preferably 50 μm or more and 300 μm or less. Further, main surfaces of surface acoustic wave device 10 preferably have a shape of a rectangle with one side length of 0.1 mm or more and 10 mm or less.

<Method for Manufacturing Surface Acoustic Wave Device>

The method for manufacturing a surface acoustic wave device in accordance with the present embodiment can include a step of preparing a joined substrate, a step of preparing a sealing substrate, and a step of joining the joined substrate and the sealing substrate to obtain a surface acoustic wave device.

Step of Preparing Joined Substrate

First, a joined substrate is prepared. The joined substrate can be obtained by forming an electrode on a main surface of the joined body described in the first embodiment. Specifically, first, piezoelectric substrate 5 in joined body 2 is thinned by polishing, and thereafter a surface thereof is cleaned by RCA cleaning. Then, an aluminum-based material to serve as an electrode is deposited on the polished surface of piezoelectric substrate 5 by electron beam evaporation to have a thickness of one hundred to several hundred angstroms.

Then, a resist is applied to the polished surface of the piezoelectric substrate with a coater, and is cured by baking. Thereafter, a pattern of electrode 3 of the surface acoustic wave device is exposed with a stepper exposure machine, and is developed with a developer.

Then, with a reactive ion etching (RIE) device, the aluminum-based material at a portion not masked with the resist is removed, leaving the aluminum-base material only at an electrode portion. The resist is removed to complete the electrode. Thereby, joined substrate 4 including piezoelectric substrate 5, electrode 3 provided on second main surface 5b of piezoelectric substrate 5, and polycrystalline spinel substrate 1 joined to first main surface 5a of piezoelectric substrate 5 can be obtained. It should be noted that first electrode member 6 can also be formed on second main surface 5b of piezoelectric substrate 5 by the same method as the method for fabricating electrode 3 described above.

It should be noted that, when the surface acoustic wave device is formed only of the joined substrate as shown in FIGS. 2 and 3, the joined substrate obtained above corresponds to surface acoustic wave device 10. When the surface acoustic wave device further includes another component in addition to the joined substrate as shown in FIG. 4, the following steps are further performed.

Step of Preparing Sealing Substrate

As sealing substrate 7, for example, a substrate made of spinel is prepared. In the substrate, via wire 8 penetrating the substrate is formed. Then, on one main surface of the substrate, second electrode member 9 is formed to cover via wire 8. In addition, on the other main surface of the substrate, external terminal 11 is formed to cover via wire 8. Thereby, sealing substrate 7 can be obtained.

Step of Obtaining Surface Acoustic Wave Device

Then, obtained joined substrate 4 and sealing substrate 7 are joined. First, adhesive member 13 made of a metal or a resin is disposed on second main surface 5b of piezoelectric substrate 5. Then, sealing substrate 7 is disposed to face second main surface 5b of piezoelectric substrate 5. On this occasion, sealing substrate 7 is disposed such that first electrode member 6 contacts second electrode member 9. Then, sealing substrate 7 is pressed against piezoelectric substrate 5 at a constant heating temperature to join sealing substrate 7 and piezoelectric substrate 5 using adhesive member 13, and thereby electrode 3 is hermetically sealed.

Then, joined substrate 4 and sealing substrate 7 are cut into a desired size with the hermetic sealing of electrode 3 being maintained, and thereby surface acoustic wave device 410 can be obtained. Further, surface acoustic wave device 410 may be obtained by cutting joined substrate 4 into a desired size and then joining it to sealing substrate 7.

EXAMPLES

The present embodiment will be further specifically described based on examples. However, the present embodiment is not limited by these examples.

(Relation between Porosity of Polycrystalline Spinel Substrate and Reflectivity of Acoustic Wave)

A simulation was performed for the relation between the porosity of the polycrystalline spinel substrate and the reflection ratio of the acoustic wave.

First, the projection plane coverage of pores to a plane parallel to a surface of the polycrystalline spinel substrate at a porosity of 0.0%, 0.002%, 0.005%, 0.1%, 0.2%, 0.3%, 0.5%, 0.6%, 0.8%, or 1.0% was calculated by the following equation (1).

$$\text{Projection Plane Coverage} = (\text{Porosity})^{2/3} \quad (1)$$

It should be noted that, it was assumed in the calculation described above that the shape of the pores was a spherical shape. The result is indicated in the column "Projection Plane Coverage" in Table 1.

TABLE 1

| Porosity [%] | 0% | 0.002% | 0.005% | 0.100% | 0.200% | 0.300% | 0.500% | 0.60% | 0.80% | 1.00% |
|---|---|---|---|---|---|---|---|---|---|---|
| Projection Plane Coverage [%] | 0% | 0.07% | 0.14% | 1.00% | 1.59% | 2.08% | 2.92% | 3.30% | 4.00% | 4.64% |
| Calculated Reflection Ratio | 1.000 | 1.013 | 1.026 | 1.176 | 1.280 | 1.356 | 1.496 | 1.580 | 1.702 | 1.813 |
| Calculated Strength Ratio | 1.0000 | 0.9999 | 0.9998 | 0.9995 | 0.9990 | 0.9985 | 0.9975 | 0.9704 | 0.9608 | 0.9512 |

The spinel sintered body constituting the polycrystalline spinel substrate is generally treated as an isotropic material, because grains thereof have different orientations from a macroscopic viewpoint. However, since the grain diameter of the crystal grains constituting the spinel sintered body is about several tens of micrometers in the usage as a surface acoustic wave device, the velocity of the acoustic wave (acoustic velocity) has anisotropy depending on orientation, although the spinel sintered body has the same density. When calculation is performed based on an assumption that the velocity of the acoustic wave (acoustic velocity) in a crystal A is 3900 m/second and the velocity of the acoustic wave (acoustic velocity) in a crystal B is 3500 m/second, reflection of acoustic impedance thereof at a boundary (crystal grain boundary) is about 5.4%.

On the other hand, when there is a void corresponding to the projection plane coverage in the polycrystalline spinel substrate, the acoustic wave is totally reflected at that portion. The reflection ratio of the acoustic wave in the polycrystalline spinel substrate having each porosity was calculated by the following equation (2).

Calculated Reflection Ratio=5.4%×(100−Projection Plane Coverage)+Projection Plane Coverage     (2)

(In the equation (2) described above, 5.4% is a reflection ratio at a porosity of 0.)

The result is indicated in the column "Calculated Reflection Ratio" in Table 1.

As indicated in Table 1, as the porosity increases, the reflection ratio of the acoustic wave increases, the effect of confining the acoustic wave in the piezoelectric substrate is enhanced, the loss of a surface acoustic wave is suppressed, and the efficiency as a surface acoustic wave device increases.

(Relation between Porosity and Strength of Polycrystalline Spinel Substrate)

When pores exist at a crystal grain boundary, the joining area between crystal grains decreases, and thus the material strength decreases. When it is assumed that the joining area is 100% at a porosity of 0.0%, the strength of the polycrystalline spinel substrate decreases as the joining area decreases. The strength at each porosity in a case where the strength at a porosity of 0.0% was set to 1 was calculated by the following equation (3).

Calculated Strength=Strength at Porosity of 0.0%× EXP (−5×Porosity)     Equation (3)

(The Equation (3) Described Above is an Equation Derived Based on the Past Experimental Data.)

The result is indicated in the column "Calculated Strength Ratio" in Table 1.

As indicated in Table 1, as the porosity decreases, the strength of the surface acoustic wave device increases.

It is clear from the results described above that, when the porosity is 0.005% or more, the effect of confining the acoustic wave can be achieved, and thus the loss of the acoustic wave can be suppressed, and when the porosity is 0.6% or less, a decrease in the strength of the polycrystalline spinel substrate is suppressed within 3%.

(Relation between Porosity and Average Grain Diameter of Crystal Grains Included in Polycrystalline Spinel Substrate)

A simulation was performed for the relation between the porosity and the average grain diameter of crystal grains included in the polycrystalline spinel substrate.

The average grain diameter (1 μm, 5 μm, 20 μm, 30 μm, 60 μm, 80 μm) of the crystal grains was multiplied by a projection plane coverage to calculate each projection pore diameter. When the projection porosity is 0.005%, the projection pore diameters are 0.04 μm, 0.18 μm, 0.74 μm, 1.11 μm, 2.21 μm, and 2.95 μm, respectively. In addition, when the projection porosity is 0.6%, the projection pore diameters are 0.18 μm, 0.9 μm, 3.6 μm, 5.4 μm, 10.9 μm, and 14.5 μm, respectively.

It was confirmed from the results of the simulation that, when the crystal grains included in the polycrystalline spinel substrate have an average grain diameter of 1 μm or less, the difference from the average particle diameter of spinel powder serving as a starting material decreases, and thus it is difficult to sufficiently decrease the porosity in the sintering process. In order to more stably decrease the porosity to a desired range, the crystal grains included in the polycrystalline spinel substrate preferably have an average grain diameter of 5 μm or more.

On the other hand, it was confirmed that, when the crystal grains included in the polycrystalline spinel substrate have an average grain diameter of more than 60 μm, there is a tendency that grains having a grain diameter of 90 μm or more actually exist, and pores existing at those portions become large, and thereby the material strength is locally significantly reduced. In order to suppress a local strength reduction, the crystal grains included in the polycrystalline spinel substrate preferably have an average grain diameter of 30 μm or less.

(Relation Between Average Grain Diameter of Crystal Grains Included in Polycrystalline Spinel Substrate and Each of Average Quality Coefficient and Variation in Quality Coefficient)

First, an average quality coefficient and variation a in quality coefficient when one-port resonator electrodes were fabricated using a joined body including a polycrystalline spinel substrate that had a porosity of 0.2% and included crystal grains having an average grain diameter of 5 μm, 20 μm, 50 μm, or 80 μm were calculated through the following procedure.

(Average Quality Coefficient)

One-port resonator electrodes were arranged in a lattice shape, on a joined substrate having a diameter of 4 inches. The substrate was cut by dicing such that one resonator electrode was arranged at each piece. Then, a probe connected to a network analyzer was applied to each electrode to measure impedance while changing the frequency. The values of L, C, and R were calculated by a simulation using the least squares method of an equivalent circuit according to the states of a resonance peak and an antiresonance peak, to derive a quality coefficient Q value. An average value was calculated from quality coefficient Q values derived from a total of 10 resonator electrodes, specifically, two resonator electrodes in the vicinity of each of five positions at the center, top, bottom, left, and right in a wafer.

The result is indicated in the column "Average Quality Coefficient" in Table 2.

(Variation σ in Quality Coefficient)

Variation σ=Maximum Value of Quality Coefficient− Minimum Value of Quality Coefficient     Equation (4)

(In the equation (4) described above, the maximum value of the quality coefficient and the minimum value of the quality coefficient are values selected from quality coefficient Q values of the 10 resonator electrodes described above.)

The result is indicated in the column "Variation 6" in Table 2.

TABLE 2

| Average Grain Diameter [μm] | 1 | 5 | 20 | 30 | 50 | 60 | 80 |
|---|---|---|---|---|---|---|---|
| Average Quality Coefficient | — | 780 | 954 | 1082 | 1257 | 1295 | 1350 |
| Variation σ | — | 186 | 261 | 282 | 325 | 398 | 562 |

When the porosity is identical, the effect of confinement by the pores is also identical. On the other hand, it was confirmed that, when the crystal grains included in the polycrystalline spinel substrate have a small average grain diameter, the abundance ratio of grain boundaries increases, and thus quality is low but variation a in quality coefficient decreases. It was also confirmed that, when the crystal grains included in the polycrystalline spinel substrate have a large average grain diameter, although there is a portion with good quality, quality is deteriorated at a portion abutting on a grain boundary, and thus variation 6 in quality coefficient increases. In order to stably obtain excellent quality, the crystal grains included in the polycrystalline spinel substrate particularly preferably have an average grain diameter of 5 μm or more and 30 μm or less.

Although the embodiments and the examples of the present disclosure have been described above, it is also originally intended to combine or variously modify the features of the embodiments and the examples described above as appropriate.

It should be understood that the embodiments and the examples disclosed herein are illustrative and non-restrictive in every respect. The scope of the present invention is defined by the scope of the claims, rather than the embodiments and the examples described above, and is intended to include any modifications within the scope and meaning equivalent to the scope of the claims.

REFERENCE SIGNS LIST

1: polycrystalline spinel substrate; 2: joined body; 3: electrode; 3a: first pole; 3b: second pole; 4: joined substrate; 5: piezoelectric substrate; 5a: first main surface; 5b: second main surface; 6: first electrode member; 7: sealing substrate; 8: via wire; 9: second electrode member; 10, 410: surface acoustic wave device; 11: external terminal; 13: adhesive member.

The invention claimed is:

1. A joined body comprising:
   a piezoelectric substrate; and
   a polycrystalline spinel substrate provided on one main surface of the piezoelectric substrate, wherein
   the polycrystalline spinel substrate has a porosity of 0.005% or more and 0.6% or less.

2. The joined body according to claim 1, wherein
   the polycrystalline spinel substrate includes a plurality of crystal grains, and
   the crystal grains have an average grain diameter of more than 1 μm and 60 μm or less.

3. The joined body according to claim 2, wherein
   the polycrystalline spinel substrate includes the plurality of crystal grains, and
   the crystal grains have an average grain diameter of 5 μm or more and 30 μm or less.

4. The joined body according to claim 1, wherein the piezoelectric substrate is made of lithium tantalate or lithium niobate.

5. A surface acoustic wave device comprising:
   the joined body according to claim 1; and
   an electrode provided on a main surface of the piezoelectric substrate opposite to the main surface provided with the polycrystalline spinel substrate.

* * * * *